United States Patent
Dobbertin et al.

(10) Patent No.: US 9,893,319 B2
(45) Date of Patent: Feb. 13, 2018

(54) RADIATION-EMITTING ORGANIC COMPONENT

(71) Applicant: OSRAM Opto Semiconductors GmbH, Regensburg (DE)

(72) Inventors: Thomas Dobbertin, Regensburg (DE); Thilo Reusch, Regensburg (DE); Nina Riegel, Tegernheim (DE); Daniel Steffen Setz, Bölingen (DE); Thomas Wehlus, Lappersdorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/370,028

(22) PCT Filed: Dec. 6, 2012

(86) PCT No.: PCT/EP2012/074687
§ 371 (c)(1),
(2) Date: Jun. 30, 2014

(87) PCT Pub. No.: WO2013/102530
PCT Pub. Date: Jul. 11, 2013

(65) Prior Publication Data
US 2015/0014668 A1    Jan. 15, 2015

(30) Foreign Application Priority Data

Jan. 4, 2012 (DE) .................. 10 2012 200 084

(51) Int. Cl.
*H01L 51/52* (2006.01)
*H01L 51/56* (2006.01)

(52) U.S. Cl.
CPC ...... *H01L 51/5268* (2013.01); *H01L 51/5206* (2013.01); *H01L 51/5221* (2013.01); *H01L 51/5275* (2013.01); *H01L 51/56* (2013.01)

(58) Field of Classification Search
CPC ... H01L 51/5268; H01L 33/22; H01L 33/508; G02B 6/004
(Continued)

(56) References Cited

U.S. PATENT DOCUMENTS

2003/0057417 A1    3/2003  Lee et al.
2005/0270763 A1*  12/2005  Koike ............... H05B 33/22
                                                    362/34

(Continued)

FOREIGN PATENT DOCUMENTS

CN     1575064 A    2/2005
CN     1610470 A    4/2005
(Continued)

OTHER PUBLICATIONS

Do, Y. et al., "Enhanced Light Extraction from Organic Light-Emitting Diodes with 2D Sio2/SiNx Photonic Crystals," Advanced Materials, Jul. 17, 2003, vol. 15, No. 14, pp. 1214-1218.
(Continued)

*Primary Examiner* — David Vu
*Assistant Examiner* — Jonathan Han
(74) *Attorney, Agent, or Firm* — McDermott Will & Emery LLP

(57) ABSTRACT

The invention relates to a radiation-emitting, organic component comprising a radiation-permeable carrier body (1) having a first surface (1a) on a top side of the carrier body (1), a radiation-permeable, structured layer (2) that is arranged on the first surface (1a) and covers same at least in places, a radiation-permeable first electrode (3) that is arranged on the side of the structured layer (2) facing away from the carrier body (1), a layer stack (10) that is arranged on the side of the first electrode (3) facing away from the structured layer (2) and comprises an organic, active region, and a second electrode (6), wherein the active region (10a)

(Continued)

can be electrically contacted via the first electrode (3) and the second electrode (6), the structured layer (2) is different from the radiation-permeable carrier body (1), and the structured layer (2) comprises structures (2a) for refracting and/or scattering electromagnetic radiation generated in the active region (100) during operation.

12 Claims, 4 Drawing Sheets

(58) Field of Classification Search
USPC ............... 257/E33.074; 313/502, 506, 599;
14/E33.074
See application file for complete search history.

(56) References Cited

U.S. PATENT DOCUMENTS

| | | | |
|---|---|---|---|
| 2005/0274969 A1* | 12/2005 | Suzuki | G02F 1/133526 257/98 |
| 2007/0257608 A1 | 11/2007 | Tyan et al. | |
| 2007/0267966 A1 | 11/2007 | Numajiri et al. | |
| 2010/0110551 A1* | 5/2010 | Lamansky | G02B 5/021 359/599 |
| 2010/0177398 A1* | 7/2010 | Watanabe | G02B 1/105 359/614 |
| 2010/0225229 A1* | 9/2010 | Hosoda | B82Y 20/00 313/504 |
| 2011/0001159 A1* | 1/2011 | Nakamura | B82Y 20/00 257/98 |
| 2011/0187264 A1* | 8/2011 | Yasuda | H01L 51/52 313/504 |
| 2011/0235327 A1* | 9/2011 | Sasaki | H01L 51/0096 362/249.01 |

FOREIGN PATENT DOCUMENTS

| | | |
|---|---|---|
| CN | 1704819 A | 12/2005 |
| CN | 1714460 A | 12/2005 |
| CN | 1759637 A | 4/2006 |
| CN | 1942308 A | 4/2007 |
| CN | 101978781 A | 2/2011 |
| DE | 102004020245 A1 | 12/2005 |
| DE | 102008031531 A1 | 1/2010 |
| DE | 102008035538 A1 | 2/2010 |
| DE | 102008035559 A1 | 2/2010 |
| DE | 102008048161 A1 | 6/2010 |
| DE | 102009022902 A1 | 10/2010 |
| EP | 2270866 A1 | 1/2011 |
| EP | 2278852 A1 | 1/2011 |
| JP | 200386353 A | 3/2003 |
| JP | 2007242286 A | 9/2007 |
| TW | 574110 B | 2/2004 |
| WO | 2005/096406 A2 | 10/2005 |
| WO | 2010/066245 A1 | 6/2010 |

OTHER PUBLICATIONS

Sun, Y. et al., "Enhanced light out-coupling of organic light-emitting devices using embedded low-index grids," Nature Photonics, Jul. 2008, vol. 2, pp. 483-487.

Ziebarth, J. et al., "Extracting Light from Polymer Light-Emitting Diodes Using Stamped Bragg Gratings," Advanced Functional Materials, May 2004, vol. 14, No. 5, pp. 451-456.

* cited by examiner

RADIATION-EMITTING ORGANIC COMPONENT

A radiation-emitting, organic component is specified.

One object to be achieved is to specify a radiation-emitting, organic component which can be operated particularly efficiently and can be produced in a simple manner.

A radiation-emitting, organic component described here is, for example, an organic light-emitting diode or an organic, light-emitting transistor.

In accordance with at least one embodiment of the radiation-emitting component, the component comprises a radiation-transmissive carrier body. The carrier body is a mechanically carrying component part of the component, in particular a substrate, to which further component parts of the component, for example in the form of layers, are applied. For this purpose, the carrier body comprises a first surface at a top side of the carrier body, on which, for example, the further layers of the component can be applied. In addition to its mechanical properties, the carrier body is an optical component part of the radiation-emitting organic component. For this purpose, the carrier body is embodied as radiation-transmissive, in particular.

Here and hereinafter the term "radiation-transmissive" relates to a transmissivity for electromagnetic radiation generated by the radiation-emitting, organic component during operation. By way of example, a radiation-transmissive component part of the radiation-emitting, organic component, for example the radiation-transmissive carrier body, is embodied in such a way that at least 50%, preferably at least 75%, particularly preferably at least 90%, of the electromagnetic radiation which is generated in the component during operation and passes into the component part emerges again from the latter.

A radiation-transmissive component part of the radiation-emitting, organic component can be embodied in this case as pellucid, transparent, translucent (light-transmissive) or milky, radiation-scattering.

Correspondingly, the term "radiation-reflecting" hereinafter relates to a reflectivity for electromagnetic radiation generated by the radiation-emitting, organic component during operation. By way of example, a radiation-reflecting component part of the radiation-emitting, organic component reflects at least 50%, preferably at least 75%, particularly preferably at least 90%, of the electromagnetic radiation which impinges on it and which is generated in the component during operation.

The first surface at a top side of the carrier body is formed in particular by a part of the outer surface of the carrier body. In this case, the first surface can be embodied as smooth within the scope of the production tolerance. Furthermore, it is possible for the first surface to have a mean roughness that is produced and set in a targeted manner. In this case, the first surface is irregularly structured, for example.

Here and hereinafter, "irregularly structured" means that the irregular structure in particular is not periodic and in particular does not form a photonic crystal. By way of example, the structuring can be regarded as random if no periodicity of the structuring, in particular in the size range of the electromagnetic radiation generated in the active region during operation, can be discerned by examination methods such as a Fourier transformation. It is possible, however, for a periodic structuring to be superimposed on the irregular structuring, wherein the periodicity is large relative to the wavelength of the electromagnetic radiation generated during the operation of the component.

In accordance with at least one embodiment of the radiation-emitting, organic component, the component comprises a radiation-transmissive, structured layer, which is arranged at the first surface and covers the latter at least in places. For example, the structured layer can completely cover the first surface of the carrier body. In particular, the structured layer covers a part, for example at least 50%, of the first surface of the radiation-transmissive carrier body. The structured layer has a structuring at its side facing away from the carrier body, for example, which structuring can be embodied as regular, periodic and/or irregular, random.

In accordance with at least one embodiment of the radiation-emitting, organic component, the component comprises a radiation-transmissive first electrode, which is arranged at that side of the structured layer which faces away from the carrier body. In this case, it is possible for at least one further layer to be arranged between the first electrode and the structured layer, such that the first electrode and the structured layer do not have a common interface. Furthermore, it is also possible, however, for the first electrode to be applied directly to the structured layer, such that these two component parts directly adjoin one another.

The first electrode is embodied as radiation-transmissive and for this purpose comprises, for example, a metal layer, a transparent conductive oxide (TCO) and/or a transparent metal oxide (TMO).

In accordance with at least one embodiment of the radiation-emitting, organic component, the component comprises a layer stack, which is arranged at that side of the first electrode which faces away from the structured layer and comprises an organic active region. The layer stack can for example directly adjoin the first electrode. The layer stack comprises for example at least one hole-conducting layer and at least one electron-conducting layer, between which the active region is arranged. Depending on the component, the active region can comprise at least one electroluminescent organic layer. Furthermore, the organic layer stack can comprise further layers such as electron-blocking and/or hole-blocking layers. The component can be designed to generate light, for example colored light or white light, during operation. In this case, the light generated by the component during operation is generated in the active region. Furthermore, it is possible for the component to be designed to emit light of different colors and/or light of different color temperatures from different sides.

With regard to the basic construction of a radiation-emitting, organic component, reference is made by way of example to the document WO 2010/066245 A1, which is expressly incorporated by reference in particular with regard to the construction of a radiation-emitting, organic component.

In accordance with at least one embodiment of the radiation-emitting, organic component, the component comprises a second electrode. In the present case, the second electrode can be embodied as radiation-transmissive or radiation-reflecting. The second electrode is applied to the organic layer stack in particular at that side of said organic layer stack which faces away from the carrier body. In this case, the second electrode can directly adjoin the layer stack.

If the second electrode is, for example, an electrode embodied as radiation-reflecting, then the electromagnetic radiation generated in the active region is emitted through the carrier body. Alternatively, it is possible for the second electrode to be embodied as radiation-transmissive. In this case, emission can take place on both sides, that is to say through the carrier body and the second electrode.

In accordance with at least one embodiment of the radiation-emitting, organic component, electrical contact can be made with the active region via the first electrode and the second electrode. That is to say that the first and second electrodes make contact with mutually electrically opposite regions of the active zone. By way of example, electrical contact can be made with, and electric current can be applied to, the two electrodes from outside the radiation-emitting, organic component.

In accordance with at least one embodiment of the radiation-emitting, organic component, the structured layer is different from the radiation-transmissive carrier body. That is to say that the structured layer and the radiation-transmissive carrier body are produced at least in two different work steps. The fact that the structured layer is different from the radiation-transmissive carrier body can furthermore mean that the structured layer differs from the radiation-transmissive carrier body with regard to the material with which these component parts are formed. In particular, the structured layer is not part of the carrier body, rather the structured layer constitutes an independent component part of the radiation-emitting, organic component which is formed on the carrier body, for example, after the latter has been provided.

In accordance with at least one embodiment of the radiation-emitting, organic component, the structured layer comprises structures provided for refracting or scattering electromagnetic radiation generated in the active region during operation. In other words, the structured layer fulfils an optical task in the radiation-emitting, organic component. Electromagnetic radiation which is generated in the active region during the operation of the component and which impinges on the structured layer is refracted and/or scattered at the structures of the structured layer.

In accordance with at least one embodiment of the radiation-emitting, organic component, the component comprises a radiation-transmissive carrier body having a first surface at a top side of the carrier body, a radiation-transmissive, structured layer, which is arranged at the first surface and covers the latter at least in places, a radiation-transmissive first electrode, which is arranged at that side of the structured layer which faces away from the carrier body, a layer stack, which is arranged at that side of the first electrode which faces away from the structured layer and comprises an organic active region, and a second electrode. In this case, electrical contact can be made with the active region via the first electrode and the second electrode. The structured layer is different from the radiation-transmissive carrier body, and the structured layer comprises structures provided for refracting or scattering electromagnetic radiation generated in the active region during operation.

In radiation-emitting, organic components such as an organic light-emitting diode, for example, the light generated in the active region is only partly coupled out directly. The light which is not coupled out directly is distributed among various loss channels such as, for example, light which remains in the carrier body, light which remains in the organic layer stack, and surface plasmons generated by the light, for example at one of the metallically conductive electrodes. It has now been found that further technical measures are necessary for coupling out this light.

In order to increase the coupling-out of light which may be trapped in a carrier body embodied as transparent for example on account of the waveguide effect, various approaches for increasing the coupling-out of light are conceivable.

By way of example, scattering particles can be introduced into the carrier body. The coupling-out efficiency in the case of such measures is approximately 60 to 70% of the light guided in the carrier body. These measures influence the appearance of the radiation-emitting, organic component, since, for example, the introduced particles give a milky, diffusely reflective impression.

Further measures for increasing the coupling-out in particular of light that is guided in the organic layer stack and/or the electrodes are, for example, structured regions formed with a material having a low refractive index, which can be applied to a radiation-transmissive electrode. Furthermore, the use of Bragg gratings or photonic crystals having periodic scattering structures which have structure sizes in the wavelength range of the light emitted by the active zone is possible.

In the component described here, it is possible in particular by virtue of the structured layer to influence in a targeted manner the emission characteristic of the radiation portion that leaves the radiation-emitting, organic component through the radiation-transmissive carrier body. In particular, the structured layer can improve a coupling-in of electromagnetic radiation generated in the active region during the operation of the radiation-emitting, organic component. That is to say that more radiation enters into the radiation-transmissive carrier body with the structured layer than would be the case without the structured layer.

As a result of the increase in the coupling-in of electromagnetic radiation into the radiation-transmissive carrier body, in particular an increase in the coupling-out of electromagnetic radiation from the radiation-emitting, organic component overall is achieved as well. In order to increase the coupling-out of electromagnetic radiation coupled into the radiation-transmissive carrier body, the radiation-transmissive carrier body can be modified further; by way of example, it can have roughenings at a second surface, facing away from the first surface, or scattering films or microlenses can be formed at said second surface. In particular, a radiation-emitting, organic component described here is distinguished by a particularly high efficiency on account of the structured layer.

In accordance with at least one embodiment of the radiation-emitting, organic component, the structured layer is formed with a material having a refractive index that is substantially equal to the refractive index of the radiation-transmissive carrier body. "Substantially equal" means, for example, that the structured layer has an optical refractive index that deviates from an optical refractive index of the carrier body by at most +/−10%. By way of example, the carrier body has a refractive index of less than 1.6, for example of 1.5. In this case, the refractive index is determined at a wavelength of $\lambda=600$ nm. In this embodiment, the structured layer then likewise has a refractive index that is in the range of the refractive index of the radiation-transmissive carrier body. Carrier body and structured layer are therefore formed with a normally refractive material.

In accordance with at least one embodiment of the radiation-emitting, organic component, the structures of the structured layer are arranged at a side of the structured layer which faces away from the carrier body and have a structure size that is greater than or equal to the wavelength of the electromagnetic radiation generated in the active region during operation. In particular, the structure size can be in the range of a few micrometers to a few 10 μm. The structures of the structured layer can then change for example the angle of incidence of electromagnetic radiation from the active region, thereby reducing the probability of the occurrence of total internal reflection at the interface with respect to the carrier body. This in turn increases the coupling of electromagnetic radiation into the radiation-transmissive carrier body.

In particular, it is possible for the structures to form optical lenses for the electromagnetic radiation generated in the active region during operation. For this purpose, these structures can comprise, for example, convexly or concavely curved surfaces. Other forms for the structures such as, for example, pyramids, truncated pyramids, truncated cones or the like are also possible.

In accordance with at least one embodiment of the radiation-emitting, organic component, the carrier body and the structured layer are formed with a glass. By way of example, the carrier body can be a glass substrate, to which a further material layer composed of glass is applied in a further process step, not associated with the glass production of the carrier body. By way of example, said layer can be formed with a glass-frit material. Afterward, the applied material can be incipiently melted or melted and can be structured with a structuring means such as, for instance, a stamp, a roller and/or a roll prior to curing.

Advantageously, the production of the structured layer does not involve intervention in the process for producing the carrier body itself, rather the structured layer is produced independently of the carrier body on the latter. This makes it possible to reduce quality requirements with respect to the material of the carrier body, as a result of which, for example, the use of cost-effective glass, such as soda-lime glass or window glass, for instance, is made possible.

In accordance with at least one embodiment of the radiation-emitting, organic component, the structured layer comprises particles or the structured layer consists of particles, wherein the particles are provided for scattering electromagnetic radiation generated in the active region during operation. In this case, the particles are arranged at the first surface of the radiation-transmissive carrier body and can be in direct contact, for example, there with the radiation-transmissive carrier body. The particles are provided for scattering electromagnetic radiation generated in the active region during operation. For this purpose, the particles can have diameters that are smaller than the wavelength of said electromagnetic radiation.

In this case, the particles of the structured layer preferably form an incomplete monolayer ply on the first surface. By way of example, the surface coverage with the particles at the first surface is at most 75%, in particular approximately 60%. In comparison with pure interface scattering, the particles increase the scattering effect at the interface between the carrier body and subsequent layers. The fact that the particles are preferably arranged only in the region of the first surface prevents the occurrence of volume scattering, such as would be the case, for example, if particles are arranged uniformly in a layer disposed downstream of the carrier body. With the use of particles at the first surface of the carrier body, the advantage in comparison with volume scattering is that a liquid material in which scattering particles cannot be dispersed homogeneously can be used for a matrix material into which the particles can be embedded.

Furthermore, it is possible that a thermal conductivity at the interface between the carrier body and the subsequent layers is increased by the particles.

In accordance with at least one embodiment of the radiation-emitting, organic component, some, in particular all, of the particles are formed with one of the following materials, that is to say that, in particular, they can contain one of the following materials or consist of one of the following materials: tantalum oxide, lanthanum oxide, hafnium oxide, zirconium oxide, $TiO_2$, AlN, SiC, MgO, $SiO_2$, $Al_2O_3$. The particles have, for example, an average diameter of between 300 nm and 3000 nm.

In accordance with at least one embodiment of the radiation-emitting, organic component, the component comprises an intermediate layer arranged between the structured layer and the first electrode, wherein the intermediate layer has an optical refractive index that is for example at least equal, preferably equal to an average optical refractive index of the layer stack and the intermediate layer has an optical refractive index that is greater than the optical refractive index of the carrier body. The intermediate layer is, in particular, a high refractive index layer having a refractive index of >1.6, in particular of >1.8. In this case, the average refractive index of the layer stack is, in particular, the layer-thickness-weighted refractive index of the organic layer stack. By way of example, the layer stack has an average optical refractive index of at least 1.6 and at most 1.9.

On account of the different optical refractive index between the carrier body and the intermediate layer and thus also between the structured layer and the intermediate layer, the scattering of electromagnetic radiation generated in the active region occurs for example at the interface between the structured layer and the intermediate layer. The probability of total internal reflection at the interface is reduced, and so a larger proportion of the radiation can enter into the carrier body and from there emerge from the component. Overall, the efficiency of the component is therefore increased on account of the high refractive index intermediate layer, since overall more radiation leaves the component than would be the case without an intermediate layer.

In this case, it is possible, in particular, for the intermediate layer to directly adjoin the structured layer and the intermediate layer to directly adjoin the first electrode or form the latter. That is to say that the intermediate layer has an interface with the structured layer and there follows for example the form of the structuring of the structured layer, that is to say the structures and/or the outer surface of the particles. Furthermore, the intermediate layer can have a common interface with the first electrode or the intermediate layer is embodied as electrically conductive and forms the first electrode.

In accordance with at least one embodiment of the radiation-emitting, organic component, a surface of the intermediate layer that faces away from the carrier body has a mean roughness that is less than a mean roughness of that surface of the structured layer which faces the intermediate layer. That is to say that the intermediate layer has a planarizing effect. On account of the intermediate layer, the subsequent layers of the component, such as, for example, the first electrode and/or the organic layer stack, can be deposited onto a smoother layer than would be the case without an intermediate layer. By way of example, at its side facing the intermediate layer, the structured layer has a mean roughness of at least 0.25 μm, preferably of at least 0.5 μm, particularly preferably of 1.0 μm. That surface of the intermediate layer which faces away from the structured layer then has a lower mean roughness of, for example, less than 0.25 μm.

In accordance with at least one embodiment of the radiation-emitting, organic component, the first surface has a mean roughness that is greater than that surface of the intermediate layer which faces away from the carrier body. That is to say that, in this embodiment, the intermediate layer has a planarizing effect with regard to the radiation-transmissive carrier body as well. By way of example, the carrier body has at its first surface a mean roughness of at least 0.25 µm, preferably at least 0.5 µm, particularly preferably of at least 1.0 µm.

In accordance with at least one embodiment of the radiation-emitting, organic component, the particles which can form the structured layer, for example, are embedded into the material of the intermediate layer. That is to say that the particles, apart from a side facing the carrier body, for example, are completely wetted with the material of the intermediate layer and surrounded on all sides by the material of the intermediate layer. In this case, it is possible, in particular, for the first surface of the carrier body, to which first surface the particles are applied, to be irregularly structured and to have a mean roughness set in a targeted manner. It has been found here that the scattering effect as a result of the introduction of the particles is increased relative to the scattering effect at the interface between carrier body and intermediate layer without scattering particles. In this case, the particles preferably have an optical refractive index that is different from the refractive index of the intermediate layer.

In accordance with at least one embodiment of the radiation-emitting, organic component, the radiation-transmissive carrier body has a structuring at the first surface, wherein the particles at least in part directly adjoin the first surface, and the structured layer comprises one or a plurality of plies of the particles. In this case, the first surface of the carrier body can be regularly or irregularly structured. At least some of the particles are in direct contact with the carrier body and touch the latter at the first surface. The plies can be closed plies—that is to say monolayer plies—or non-closed plies—that is to say submonolayer plies. At least the particles of the bottommost ply facing the carrier body are then at least in part in direct contact with the carrier body and form an interface with the latter.

In accordance with at least one embodiment of the radiation-emitting, organic component, a barrier layer is arranged between the first electrode and the intermediate layer, which barrier layer at least inhibits the passage of liquid and/or gases. "At least inhibits" means that in a predefined time interval more liquid and/or gases penetrate into the intermediate layer without the layer than with the layer.

In particular with the use of a barrier layer, the intermediate layer can also be deposited onto the carrier body from a liquid phase. An advantageous result here is that a subsequent planarization step for reducing the mean roughness of that surface of the intermediate layer which faces away from the carrier body can be omitted, since, upon application to the carrier body from the liquid phase, the structuring of the rough region of the carrier body is not reproduced by the intermediate layer. By way of example, the intermediate layer can be applied by means of a sol-gel method.

By way of example, the intermediate layer can be a high refractive index glass. Furthermore, materials such as polycarbonate, PEN, PET, polyurethane, acrylates, epoxides, PMMA and further plastics can also be used as the intermediate layer. These materials can optionally be used with additives for matching the refractive index such as, for example, metal-oxidic nanoparticles having particle diameters of less than 50 nm, preferably less than 40 nm. By way of example, $TiO_2$ nanoparticles having a particle diameter of less than 50 nm are appropriate for this purpose. The materials which are sold under the name "OptiNDEX" or "CNTRENE" by "Brewer Science" and which can be applied from the liquid phase are also suitable for forming the intermediate layer.

An increase in the thermal conductivity, in particular of the intermediate layer deposited onto the carrier body from the liquid phase, can be achieved by the introduction of particles having a high thermal conductivity. By way of example, for this purpose, particles composed of AlN, SiC, MgO having thermal conductivities of up to 590 W/mK can be introduced into the material of the intermediate layer.

In accordance with at least one embodiment of the radiation-emitting, organic component, the intermediate layer and/or the barrier layer inhibit(s) the passage of UV radiation or prevent(s) the passage of UV radiation. That is to say that at least one of the two layers has filter properties with regard to UV radiation. In this way, the layers of the organic layer stack which can be damaged or destroyed by UV radiation can be protected from the latter. By way of example, for this purpose the intermediate layer and/or the barrier layer contain(s) a material which absorbs, reflects or scatters UV radiation. These materials can be introduced in particular in a particularly simple manner into an intermediate layer deposited on the carrier body from a liquid phase.

By way of example, particles of inorganic materials such as $TiO_2$ or organic UV-radiation-absorbing materials such as, for example, 2-hydroxybenzophenones, 2-hydroxyphenylbenzotriazoles, salicylic esters, cinnamic ester derivatives, resorcinol monobenzoates, oxanilides, p-hydroxybenzoic esters are appropriate for this purpose. In this case, it is also possible for these materials to be arranged in a separate layer above or below the intermediate layer, which is formed with a high refractive index material available as matrix material for the materials specified.

Furthermore, the intermediate layer can also be subdivided into at least two sublayers, of which, for example, one sublayer is free of the UV-absorbing materials, whereas the other sublayer contains the UV-absorbing materials.

Methods for producing a radiation-emitting, organic component described here are furthermore specified. Radiation-emitting, organic components described here can be produced by means of the methods, and so all features disclosed for the radiation-emitting organic component are also disclosed for the methods described here, and vice versa.

In accordance with a first method for producing a radiation-emitting, organic component, firstly the radiation-transmissive carrier body is provided. By way of example, the radiation-transmissive carrier body is formed in this case with a glass, in particular with a cost-effective glass such as window glass, for example.

In this case, the first surface of the radiation-transmissive carrier body can be embodied as smooth within the scope of the production tolerance, that is to say that the first surface in this case does not have an irregular structuring introduced in a targeted manner; the mean roughness at the surface is less than 0.25 µm.

In a further method step, a glass-containing material, for example in the form of glass frits, is applied to the first surface of the carrier body. Afterward, said vitreous material, which in particular has a lower melting point than the material of the radiation-transmissive carrier body, is melted or incipiently melted. The material softened and deformable in this way is subsequently structured, such that the structured layer is formed by the structuring of that surface of the glass-containing material which faces away from the carrier body. The structures produced in this way can be lens-shaped for example as described above. The structures are produced for example by means of a stamp, a roller and/or a roll.

Furthermore, a further method for producing a radiation-emitting, organic component is specified, wherein firstly a radiation-transmissive carrier body is again provided. Said carrier body can optionally have an irregularly structured first surface having, for example, a mean roughness of at least 0.25 µm. In the face of a radiation-transmissive carrier body formed with glass, said surface can be produced by an etching method, for example.

In a subsequent method step, an intermediate layer is applied to the first surface of the carrier body from the liquid phase. In this case, the particles provided for scattering electromagnetic radiation generated in the active region can be dispersed into the intermediate layer. Furthermore, it is possible for the particles to be sprinkled into the intermediate layer already applied. The particles subsequently sediment in the liquid intermediate layer in the direction of the first surface of the carrier body, where they form a sub-monolayer ply that covers, in particular incompletely, the first surface. Finally, the intermediate layer is cured. This results in a construction in which a structured layer formed with particles is disposed downstream of the carrier body, the intermediate layer in turn being disposed downstream of said structured layer.

A further method for producing a radiation-emitting, organic component is specified. This method once again firstly involves providing the radiation-transmissive carrier body, which can be embodied as smooth or irregularly structured at its first surface. Particles that form the structured layer are subsequently applied to the first surface of the carrier body in order to form the structured layer. This can be carried out for example by methods such as sputtering or vapor deposition. The intermediate layer is subsequently applied to the structured layer.

In this case, the intermediate layer is formed in particular from with a glass and/or a material not processed in liquid form and is applied to the structured layer.

By way of example the intermediate layer can then be a high index glass layer or a layer which is applied from the gas phase to the carrier body and there in particular the rough region. By way of example, the intermediate layer can be applied to the carrier body by means of methods such as vapor deposition, CVD, PECVD or ALD. The intermediate layer can then be formed for example with a nitride or oxide such as, for example, SiN, $Al_2O_3$, $ZrO_2$, $TiO_2$, $HfO_2$, tantalum oxide and/or lanthanum oxide. An additional barrier layer between intermediate layer and first electrode can advantageously be dispensed with for such layers. These layers disadvantageously reproduce the structure of the rough region also at their surface facing away from the rough region. In order to reduce the roughness of this surface, these layers have to be planarized after they have been applied, which can be carried out for example by means of a polishing step such as so-called chemical mechanical polishing (CMP).

The radiation-emitting, organic component described here and the methods for producing such a component as described here are explained in greater detail below on the basis of exemplary embodiments and the associated figures.

Figure 1:
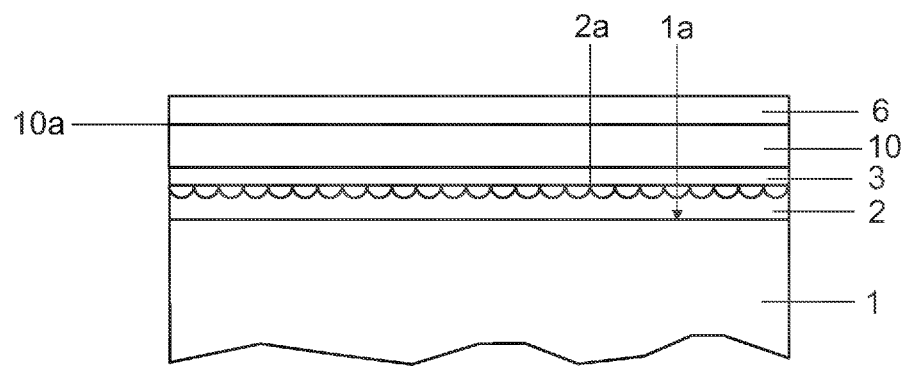
FIG. 1 shows a schematic sectional illustration of a first exemplary embodiment of a radiation-emitting, organic component.
Figure 2:
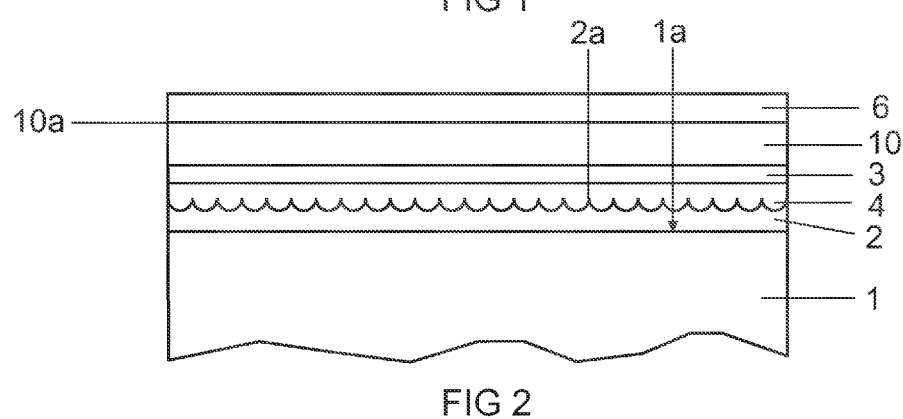
FIG. 2 shows a schematic sectional illustration of a further exemplary embodiment of a radiation-emitting, organic component.
Figure 3:
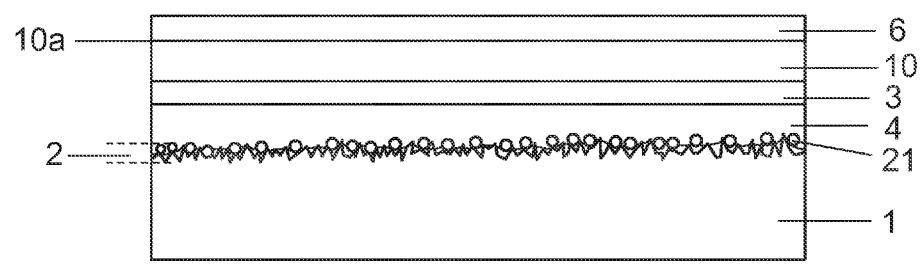
FIG. 3 shows a schematic sectional illustration of a further exemplary embodiment of a radiation-emitting, organic component.

The schematic sectional illustrations in FIGS. 1, 2 and 3 show exemplary embodiments of radiation-emitting, organic components described here.

Figure 4:
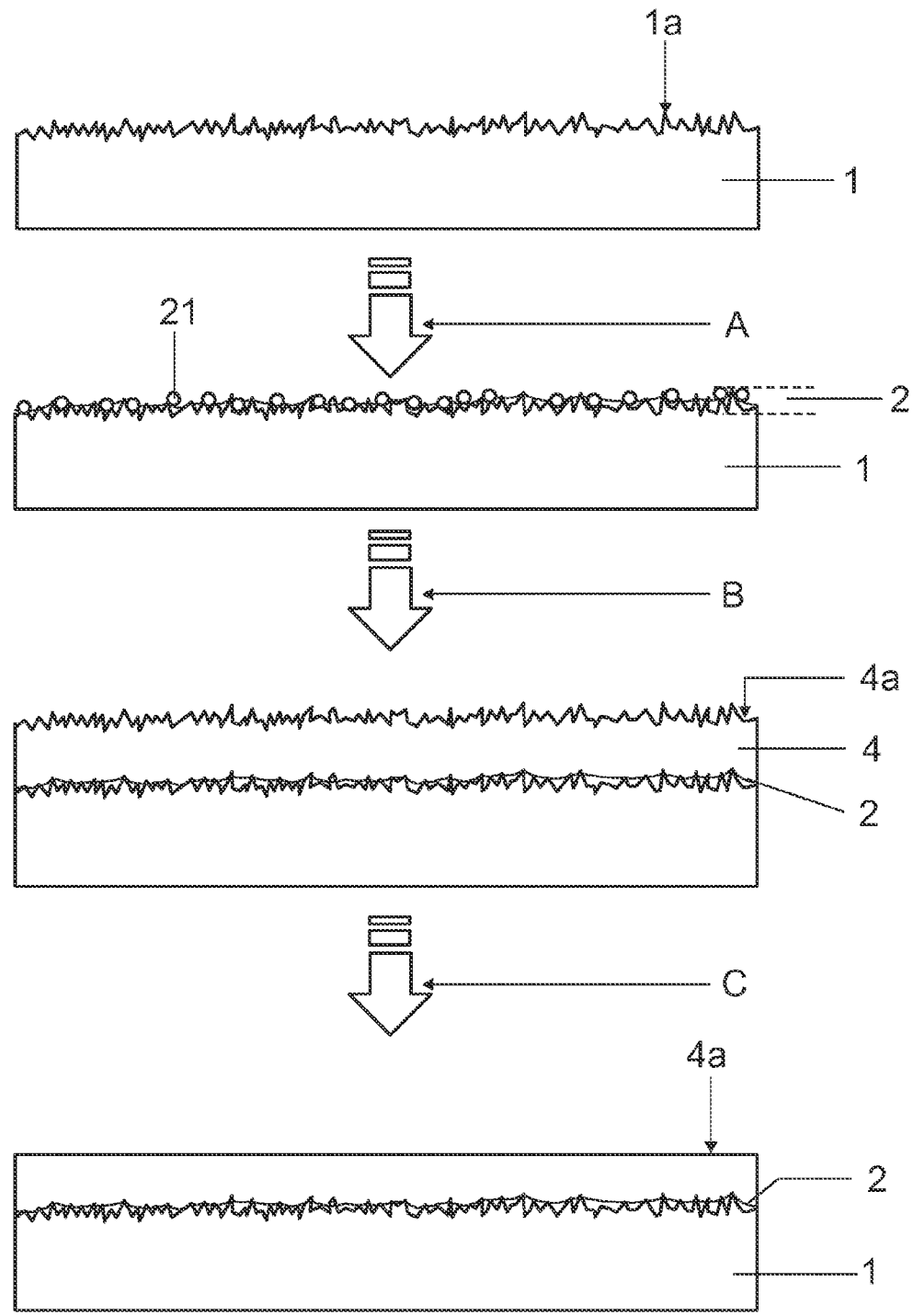
FIG. 4 shows schematic sectional illustrations of a first exemplary embodiment of a method for producing a radiation-emitting, organic component.
Figure 5:
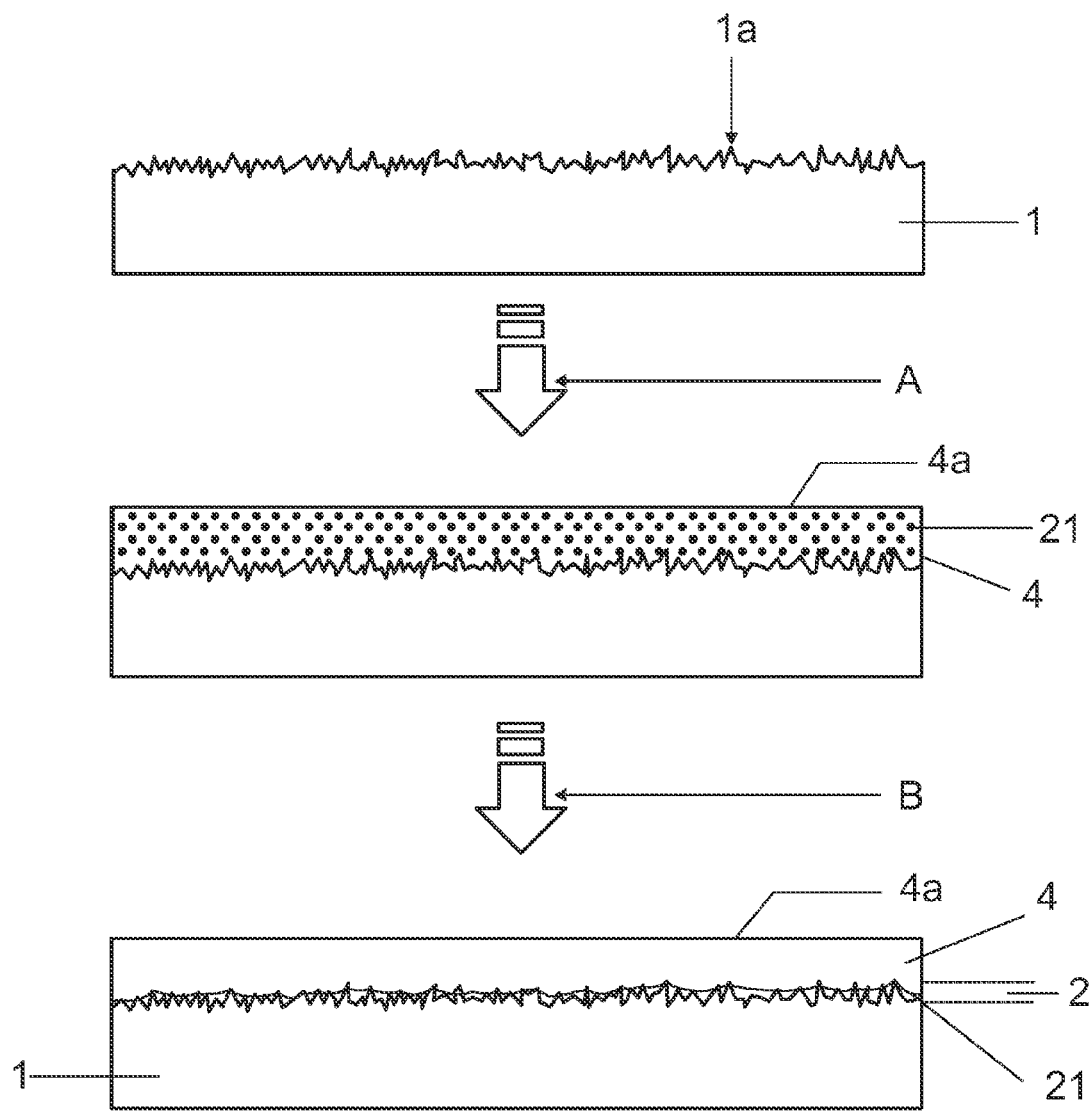
FIG. 5 shows schematic sectional illustrations of a further exemplary embodiment of a method for producing a radiation-emitting, organic component.
Figure 6:
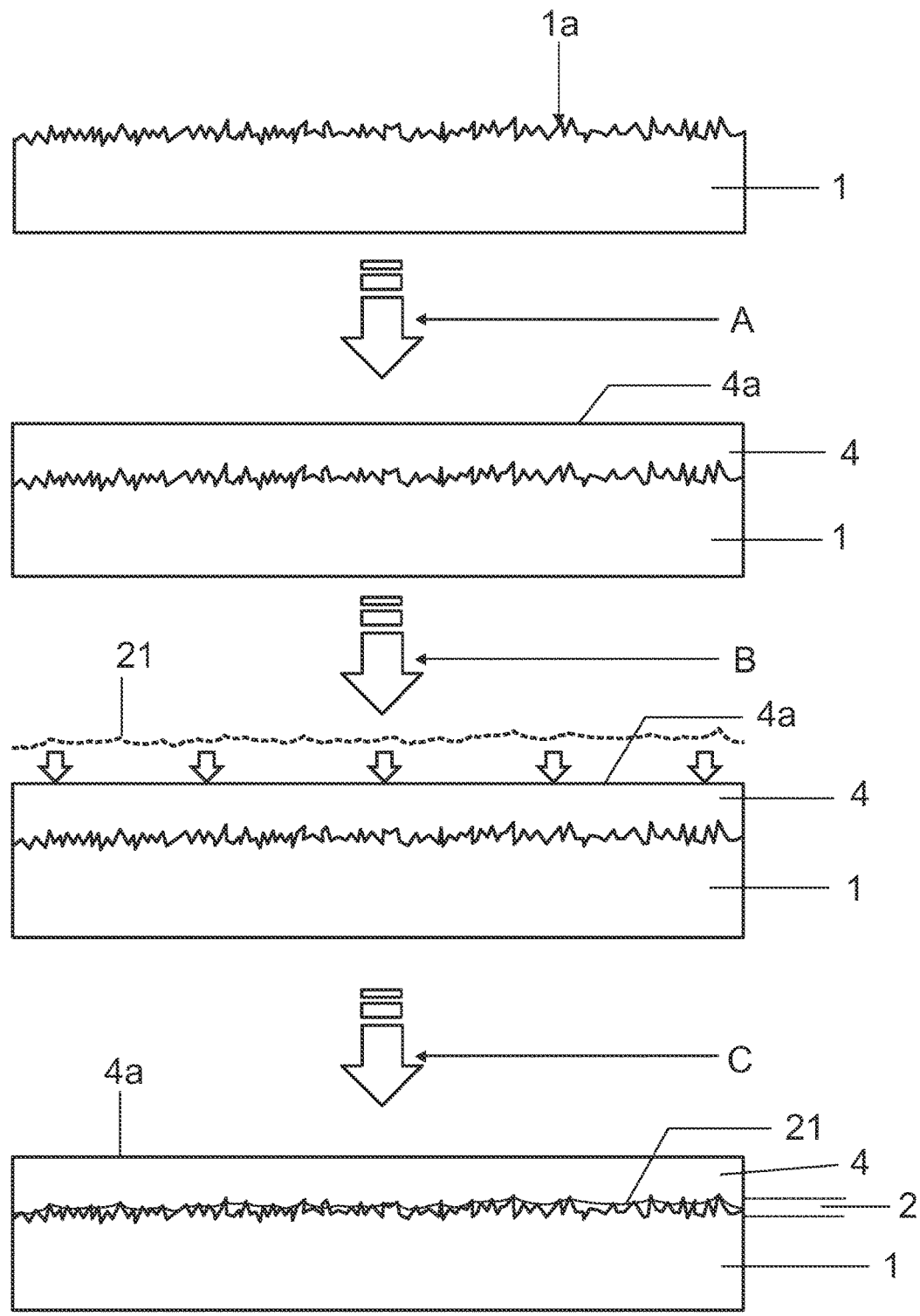
FIG. 6 shows schematic sectional illustrations of a further exemplary embodiment of a method for producing a radiation-emitting, organic component.

With reference to the schematic sectional illustrations in FIGS. 4, 5 and 6, methods for producing such components as described here are explained in greater detail.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

FIG. 1 shows a schematic sectional illustration of a first exemplary embodiment of a radiation-emitting, organic component described here. The component comprises a radiation-transmissive carrier body 1. In the present case, the radiation-transmissive carrier body 1 is embodied as a glass substrate having a low refractive index, and having for example a refractive index of 1.5 at a wavelength of 600 nm.

The radiation-transmissive carrier body 1 has a first surface 1a at its top side. In the present case, the first surface 1a is embodied as smooth within the scope of the production tolerance. That is to say that no further measures have been undertaken to provide the first surface 1a with a regular or irregular structuring.

The structured layer 2 is applied directly to the first surface 1a. In the present case, the structured layer is formed with a glass material embodied with a low refractive index in the same way as the radiation-transmissive carrier body. By way of example, the structured layer 2 likewise has an optical refractive index of 1.5 at 600 nm. At its side facing away from the radiation-transmissive carrier body 1, the structured layer 2 has structures 2a. In the present case, the structures 2a are embodied in a regular fashion and have structure sizes in the range of a few micrometers to a few 10 µm. In particular, the structure sizes are larger than a wavelength of the electromagnetic radiation generated in the component.

The size of the structures 2a is chosen, in particular, in such a way that geometrical optics is applicable to the interaction between this electromagnetic radiation and the structures 2a. In this case, the structuring can be effected periodically or non-periodically. The structures 2a can be embodied as lens-shaped, that is to say with convexly or concavely curved surfaces, pyramidal, truncated-pyramid-shaped, truncated-cone-shaped or the like.

The first electrode 3 directly adjoins the structured layer 2. The first electrode 3 is embodied in particular with a high refractive index and has a refractive index of n>1.6 at a wavelength of 600 nm.

The first electrode is furthermore preferably embodied as radiation-transmissive and for this purpose can be formed for example with a TCO (transparent conductive oxide—radiation-transmissive conductive oxide), such as ITO, ZnO, $SnO_2$. The thickness can be between 50 nm and 200 nm, for example. Furthermore, the first electrode 3 can be formed with a thin metal film, which can contain for example at least one of the following materials: AgPt, Au, Mg, Ag:Mg.

Furthermore, the radiation-transmissive first electrode 3 can be a percolation anode formed with a metallic nanowire—possible materials here include for example Ag, Ir, Au, Cu, Cr, Pd, Pt—, with a semiconductor nanowire—possible materials here include InAs, Si or further materials, if appropriate with a suitable doping—graphene particles or carbon nanotubes. The stated materials for the radiation-transmissive first electrode 3 can in this case also be combined in combination with conductive polymers such as PEDOT or PANI and/or transition metal oxides or transparent conductive oxides from the liquid phase. As further material for forming a transparent electrode, it is possible to use a TMO (transparent metal oxide) material, which can be applied to the intermediate layer 2 in particular from a solution. In this case, the radiation-transmissive first electrode 3 can consist of the TMO material or contain such a material. In particular, it is possible for the TMO material in combination with a metal or an organic material to form the electrode.

The layer stack 10 follows at that side of the first electrode 3 which faces away from the structured layer 2, said layer stack comprising, inter alia, the active region 10*a*, in which electromagnetic radiation is generated during the operation of the component.

At that side of the layer stack 10 which faces away from the transparent electrode 3, the component is terminated by the reflective electrode 6. For this purpose, the reflective electrode 6 can be formed for example with a reflective material such as aluminum or silver. In this case, the reflectivity of the second electrode 6, which can form the cathode of the component, for example, is at least 80% for the radiation generated in the active zone during operation.

On account of the structured layer 2, it is possible to couple as much electromagnetic radiation generated in the active region 10*a* as possible into the radiation-transmissive carrier body 1. Since the structures 2*a* are produced in a layer formed independently of the radiation-transmissive carrier body 1, a window glass that can be produced cost-effectively can be used, for example, as the radiation-transmissive carrier body.

In conjunction with FIG. 2, a further exemplary embodiment of a radiation-emitting, organic component described here is explained in greater detail with reference to a schematic sectional illustration. In contrast to the exemplary embodiment in FIG. 1, the component in the exemplary embodiment in FIG. 2 has an intermediate layer 4 formed with a high refractive index material having a refractive index of >1.6, in particular of >1.8, at a wavelength of 600 nm. In particular, the refractive index of the intermediate layer 4 is chosen to be greater than an average refractive index of the layer sequence 10 and chosen to be greater than the refractive index of the radiation-transmissive carrier body 1 and of the structured layer 2. Such a high refractive index layer increases the probability of electromagnetic radiation being coupled into the radiation-transmissive carrier body 1. The intermediate layer 4 can in this case be applied as described in conjunction with FIGS. 4 to 6.

In conjunction with FIG. 3, a further exemplary embodiment of a radiation-emitting, organic component described here is explained in greater detail. In contrast to the exemplary embodiments in FIG. 1 and FIG. 2, the structured layer 2 in the present case is formed by a layer of particles 21 provided for scattering electromagnetic radiation generated in the active region 10*a* during operation. The particles 21 form a layer at the first surface 1*a* of the radiation-transmissive carrier body 1, which layer covers the first surface 1*a* for example with a degree of coverage of at most 90%, for example 75%.

The particles 21 are embedded into the material of the high refractive index intermediate layer 4. That is to say that the intermediate layer wets the exposed part of the outer surface of the particles 21 that is not in direct contact with the carrier body 1.

The radiation-transmissive carrier body 1 has at its first surface 1*a* an irregular structuring having, for example, a mean roughness of at least 0.25 µm. The scattering particles 21 of the structured layer 2 further increase the scattering effect at said surface. On account of the particles 21, the structured layer 2 has a substantially irregular structuring; in particular, the structures 2*a* are predefined by the outer contour and the distribution of the particles 21.

In conjunction with FIG. 4, a first exemplary embodiment of a method described here is explained in greater detail with reference to schematic sectional illustrations. The method involves firstly providing a radiation-transmissive carrier body 1, which can be irregularly roughened in a targeted manner at its first surface 1*a*. By way of example, the mean roughness at the first surface 1*a* is at least 0.25 µm.

In a subsequent method step A, particles 21 for forming the structured layer 2 are applied to the first surface 1*a*. By way of example the particles 21 are applied by vapor deposition or sprinkling. At the first surface 1*a*, the particles 21 form a submonolayer ply, for example, that is to say do not completely cover the first surface 1*a*.

In a subsequent method step B, the high refractive index intermediate layer 4 is deposited from the non-liquid phase onto the radiation-transmissive carrier body 1 and the structured layer 2. The intermediate layer 4 thus embeds the particles 21 of the structured layer 2. The intermediate layer 4 applied in this way reproduces, at its surface 4*a* facing away from the carrier body 1, the structuring at the first surface 1*a* of the carrier body 1 and the structured layer 2.

In a subsequent method step C, the surface 4*a* of the intermediate layer 4 that faces away from the carrier body 1 can be planarized, that is to say that the mean roughness of the surface 4*a* is reduced for example by chemical mechanical polishing. In this way, the intermediate layer 4 has a planarizing effect for the structuring predefined by the first surface 1*a* of the radiation-transmissive carrier body 1 and the particles 21 of the structured layer 2.

In conjunction with FIG. 5, a further exemplary embodiment of a method described here is explained in greater detail. In contrast to the method described in conjunction with the figure, in the present case the intermediate layer 4 is applied to the first surface 1*a* of the carrier body 1 from the liquid phase. A step for reducing the mean roughness of the intermediate layer 4 (cf. step B) can therefore optionally also be omitted.

In this embodiment of the method, the particles 21 which are provided for scattering radiation and which form the structured layer 2 are applied together with the intermediate layer 4, that is to say in a manner dispersed in the material of the intermediate layer 4, see step A. Before the intermediate layer 4 is cured, the particles sediment to the first surface 1*a* of the carrier body 1 and form the structured layer 2 in this way. In method step B, the intermediate layer 4 is then cured.

In conjunction with FIG. 6, a further exemplary embodiment of a method described here is explained in greater detail. In contrast to the method in FIG. 5, after the intermediate layer 4 has been applied in method step A, in method step B the particles 21 are sprinkled onto the intermediate layer 4 and subsequently sediment in the direction of the first surface 1a. Finally, method step C once again involves subsequently curing the intermediate layer 4, and optionally reducing the roughness of the surface 4a of the intermediate layer 4.

This invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting, organic component comprising:
a radiation-transmissive carrier body having a first surface at a top side of the radiation-transmissive carrier body;
a radiation-transmissive, structured layer, which is arranged at the first surface and covers the latter at least in places;
a radiation-transmissive first electrode, which is arranged at that side of the radiation-transmissive, structured layer which faces away from the radiation-transmissive carrier body;
a layer stack, which is arranged at that side of the first electrode which faces away from the radiation-transmissive, structured layer and comprises an organic active region; and
a second electrode,
wherein
electrical contact can be made with the active region via the first electrode and the second electrode,
the radiation-transmissive, structured layer is different from the radiation-transmissive carrier body,
the radiation-transmissive, structured layer comprises structures provided for refracting electromagnetic radiation generated in the active region during operation,
the radiation-transmissive carrier body is the primary structural support of the radiation emitting organic component,
the structures of the radiation-transmissive, structured layer are formed into the radiation-transmissive, structured layer at that side of the radiation-transmissive, structured layer which faces away from the radiation-transmissive carrier body and have a structure size that is greater than or equal to the wavelength of the electromagnetic radiation generated in the active region during operation,
the structures of the radiation-transmissive, structured layer consist of a material of the radiation-transmissive, structured layer, and
the radiation-transmissive, structured layer is free of light-scattering particles.

2. The radiation-emitting, organic component according to claim 1, wherein the radiation-transmissive carrier body and the radiation-transmissive, structured layer are formed with a glass.

3. The radiation-emitting, organic component according to claim 1, comprising an intermediate layer arranged between the radiation-transmissive, structured layer and the first electrode, wherein
the intermediate layer has an optical refractive index that is at least equal to an average optical refractive index of the layer stack, and
the intermediate layer has an optical refractive index that is greater than the optical refractive index of the radiation-transmissive carrier body.

4. The radiation-emitting, organic component according to claim 3, wherein the intermediate layer directly adjoins the radiation-transmissive, structured layer and the intermediate layer directly adjoins the first electrode or forms the latter.

5. The radiation-emitting, organic component according to claim 3, wherein a surface of the intermediate layer that faces away from the radiation-transmissive carrier body has a mean roughness that is less than a mean roughness of the surface of the radiation-transmissive, structured layer that faces the intermediate layer.

6. The radiation-emitting, organic component according to claim 3, wherein the first surface has a mean roughness that is greater than the surface of the intermediate layer that faces away from the radiation-transmissive carrier body.

7. The radiation-emitting, organic component according to claim 3, wherein particles are embedded into the material of the intermediate layer.

8. The radiation-emitting, organic component according to claim 7, wherein at least some, in particular all, of the particles contain one of the following materials or consist of one of the following materials: tantalum oxide, lanthanum oxide, hafnium oxide, zirconium oxide, $TiO_2$, AlN, SiC, MgO, $SiO_2$, $Al_2O_3$.

9. A method for producing a radiation-emitting, organic component according to claim 3 comprising the following steps:
providing the radiation-transmissive carrier body;
applying the intermediate layer from the liquid phase and the particles to the first surface of the radiation-transmissive carrier body;
sedimenting the particles in the liquid intermediate layer in order to form the radiation-transmissive, structured layer; and
curing the intermediate layer.

10. A method for producing a radiation-emitting, organic component according to claim 1 comprising the following steps:
providing the radiation-transmissive carrier body;
applying a glass-containing material to the first surface of the radiation-transmissive carrier body;
melting or incipiently melting the glass-containing material; and
structuring that surface of the glass-containing material which faces away from the radiation-transmissive carrier body to form the radiation-transmissive, structured layer.

11. The radiation-emitting, organic component according to claim 1, wherein
the radiation-transmissive carrier body has a structuring at the first surface, and
the radiation-transmissive carrier body has a mean roughness of at least 0.25 µm at the first surface.

12. The radiation-emitting, organic component according to claim 1, wherein the structures of the radiation-transmissive, structured layer form optical lenses for the electromagnetic radiation generated in the active region during operation.

* * * * *